(12) United States Patent
Matsuda et al.

(10) Patent No.: US 8,286,028 B2
(45) Date of Patent: Oct. 9, 2012

(54) BACKUP METHOD AND DISK ARRAY APPARATUS

(75) Inventors: Shinnosuke Matsuda, Kawasaki (JP); Sadayuki Ohyama, Kawasaki (JP); Kentaro Yuasa, Kawasaki (JP); Takanori Ishii, Kawasaki (JP); Yoko Kawano, Kawasaki (JP); Yuji Hanaoka, Kawasaki (JP); Nina Tsukamoto, Kawasaki (JP); Tomoharu Muro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/849,423

(22) Filed: Aug. 3, 2010

(65) Prior Publication Data

US 2010/0318844 A1 Dec. 16, 2010

Related U.S. Application Data

(63) Continuation of application No. PCT/JP2008/052144, filed on Feb. 8, 2008.

(51) Int. Cl.
*G06F 11/00* (2006.01)
(52) U.S. Cl. .................. 714/6.24; 714/773; 714/758
(58) Field of Classification Search .................. 714/758, 714/6.24, 773
See application file for complete search history.

(56) References Cited

U.S. PATENT DOCUMENTS

| 5,889,933 | A | 3/1999 | Smith | |
|---|---|---|---|---|
| 6,023,780 | A | 2/2000 | Iwatani | |
| 6,185,134 | B1 | 2/2001 | Tanaka | |
| 2002/0087652 | A1* | 7/2002 | Davis et al. | 709/213 |
| 2003/0043647 | A1 | 3/2003 | Kanamori et al. | |
| 2004/0008554 | A1 | 1/2004 | Kanamori et al. | |
| 2004/0163028 | A1* | 8/2004 | Olarig | 714/767 |
| 2005/0041553 | A1 | 2/2005 | Aizawa | |
| 2005/0246574 | A1 | 11/2005 | Kanamori et al. | |
| 2005/0259460 | A1* | 11/2005 | Sone | 365/145 |
| 2006/0233032 | A1 | 10/2006 | Kanamori et al. | |
| 2008/0104481 | A1* | 5/2008 | Ito | 714/758 |
| 2008/0163029 | A1* | 7/2008 | Hirano et al. | 714/764 |
| 2009/0006923 | A1* | 1/2009 | Gara et al. | 714/758 |

(Continued)

FOREIGN PATENT DOCUMENTS

JP 5-250274 9/1993
(Continued)

OTHER PUBLICATIONS

International Search Report for PCT/JP2008/052144, mailed May 13, 2008.

(Continued)

*Primary Examiner* — Bryce Bonzo
(74) *Attorney, Agent, or Firm* — Staas & Halsey LLP

(57) ABSTRACT

A backup method makes a backup of cache data to a nonvolatile memory by using a controller, the cache data being stored in the volatile memory. The backup method includes writing the cache data stored in the volatility memory in a selected area of the nonvolatile memory, generating party data by operating the parity operations between each of the predetermined parts of the cache data in the volatile memory, verifying whether an error found in the part of the cache data in the nonvolatile memory can be recovered by using the parity data, and rewriting the part of the cache data when the error found in the part of the cache data in the nonvolatile memory cannot be recovered by using the parity data in an area of the nonvolatile memory different from the selected area.

20 Claims, 11 Drawing Sheets

U.S. PATENT DOCUMENTS

2009/0199073 A1* 8/2009 Kanaoka et al. ............. 714/758
2009/0259917 A1* 10/2009 Spencer ...................... 714/758

FOREIGN PATENT DOCUMENTS

| JP | 6-309234 | 11/1994 |
|---|---|---|
| JP | 8-220198 | 8/1996 |
| JP | 9-305328 | 11/1997 |
| JP | 10-320135 | 12/1998 |
| JP | 2000-173289 | 6/2000 |
| JP | 2000-357059 | 12/2000 |
| JP | 2003-76615 | 3/2003 |
| JP | 2004-21811 | 1/2004 |
| JP | 2005-56394 | 3/2005 |
| JP | 2005-332471 | 12/2005 |

OTHER PUBLICATIONS

English Translation of Japanese Office Action mailed Dec. 13, 2011 issued in corresponding Japanese Patent Application No. 2009-552364.

Japanese Office Action dated Jul. 31, 2012 issued in Japanese Patent Application No. 2009-552364.

* cited by examiner

FIG. 9

| 218 | Dirty | Invalid |
|---|---|---|
| | 0 | 0 |
| | 0 | 0 |
| | 0 | 1 |
| | 0 | 0 |
| | 0 | 1 |
| | 0 | 1 |
| | 0 | 1 |
| | 1 | 0 |
| | 0 | 0 |
| | 0 | 0 |
| | 1 | 0 |
| | 0 | 0 |
| | 0 | 0 |

901 — Dirty column
902 — Invalid column

BACKUP METHOD AND DISK ARRAY APPARATUS

CROSS-REFERENCE TO RELATED APPLICATION

This is a continuation of Application PCT/JP2008/052144, filed on Feb. 8, 2008, the entire contents of which are incorporated herein by reference.

FIELD

The embodiment discussed herein is related to backup control cache data of a disk array apparatus such as a RAID system.

BACKGROUND

RAID systems have a backup unit (battery) in case that a power outage stops the supply of power to the RAID systems. When a power outage occurs, such a RAID system supplies power from the backup unit to a volatile memory provided in a controller module so as to protect data stored in the volatile memory. Until power to the RAID system is restored, the RAID system continues to supply power from the backup unit to the volatile memory. As a result, the volatile memory continues to store data.

However, since the power capacity of the backup unit is limited, the data guarantee of the volatile memory depends on the electric capacity of the backup unit. If the capacity of the backup unit is increased, the reliability of the data guarantee of the volatile memory can be increased. However, the increase in the number of backup units increases the cost and size of the RAID system. Furthermore, after power has been restored, since it is impossible to ensure the backup of data until the backup unit is recharged, a write-through state is set in the RAID system. As a result, the processing power of the RAID system is significantly reduced. The write-through state is a state in which, when the controller module has successfully written data into a disk, the controller module notifies a host computer of the completion of writing of the data in the disk.

The following patent documents describe backup control for a RAID system.

[Patent Document 1] Japanese Laid-open Patent Publication No. 2005-332471
[Patent Document 2] Japanese Laid-open Patent Publication No. 6-309234
[Patent Document 3] Japanese Laid-open Patent Publication No. 2000-357059
[Patent Document 4] Japanese Laid-open Patent Publication No. 8-220198

SUMMARY

According to an aspect of the invention, a backup method for making a backup of cache data to a nonvolatile memory by using a controller, the cache data being stored in the volatile memory, the backup method includes writing the cache data stored in the volatility memory in a selected area of the nonvolatile memory, generating party data by operating the parity operations between each of the predetermined parts of the cache data in the volatile memory, verifying whether an error found in the part of the cache data in the nonvolatile memory can be recovered by using the parity data, and rewriting the part of the cache data when the error found in the part of the cache data in the nonvolatile memory cannot be recovered by using the parity data in an area of the nonvolatile memory different from the selected area.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 9 is a diagram illustrating an example of a defect management table 218 according to an embodiment.

DESCRIPTION OF EMBODIMENT

Figure 1:
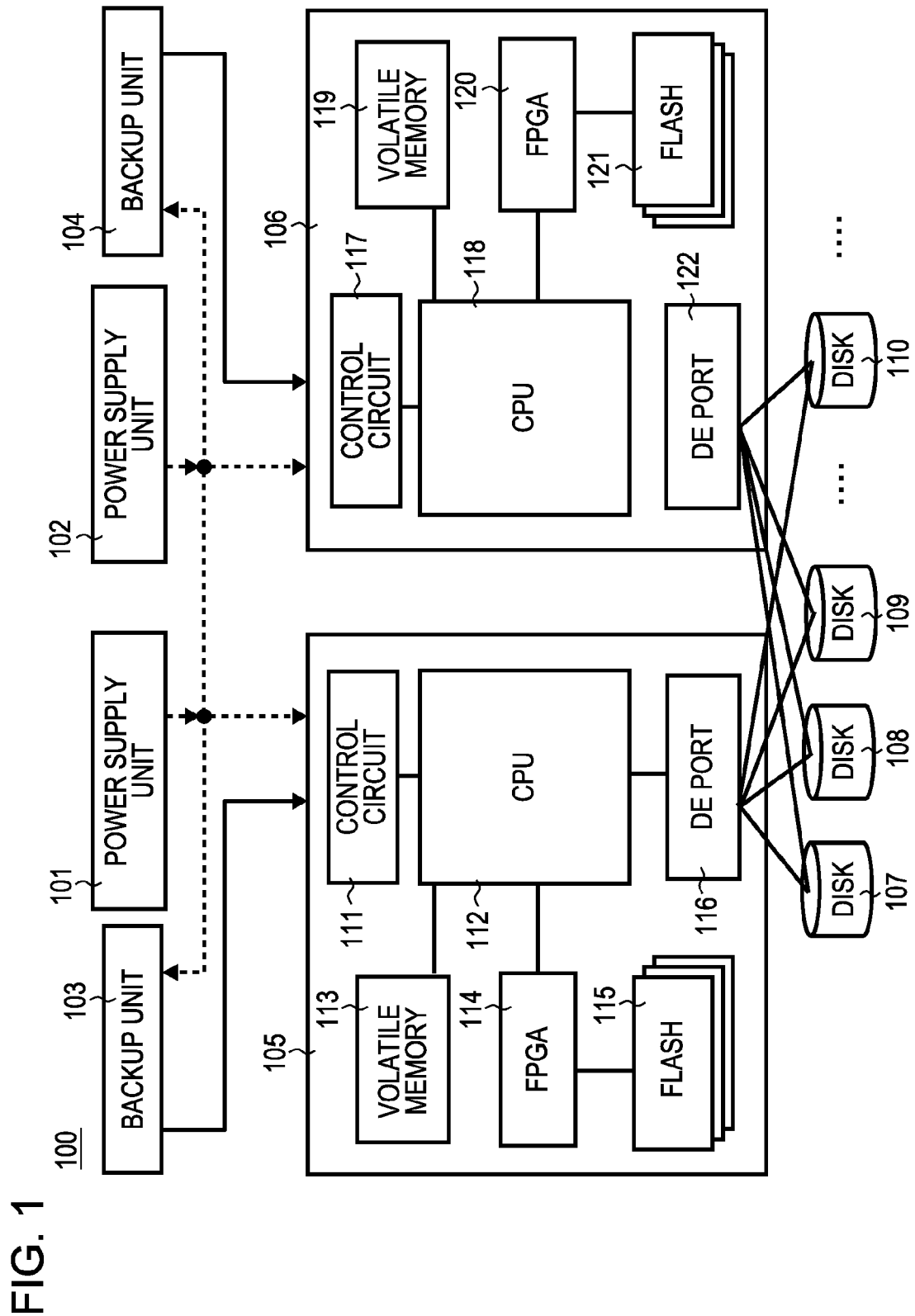
FIG. 1 is a diagram illustrating the configuration of a disk array apparatus 100 according to an embodiment.

[1. Disk Array Apparatus 100]
FIG. 1 is a diagram illustrating the configuration of a disk array apparatus 100 according to an embodiment.

The disk array apparatus 100 includes power supply units 101 and 102, backup units 103 and 104, controller modules (CMs) 105 and 106, and disks 107, 108, 109, and 110.

Each of the CMs 105 and 106 accesses the disks 107 to 110 and performs writing/reading of data in response to a writing/reading instruction transmitted from a host computer (not illustrated).

[1.1. Power Supply Units 101 and 102]
An external source supplies power to the disk array apparatus 100 via the power supply units 101 and 102. The disk array apparatus 100 has two AC/DC power supply units, the power supply units 101 and 102, so as to receive power from the external source even if one of these power supply units fails. That is, with the redundant configuration of the power supply units 101 and 102, the disk array apparatus 100 can solve the problem of the failure of a power supply unit. The power supply units 101 and 102 function as a standby power supply and a system power supply. The standby power supply is a power supply of 5 V for supplying at least the minimum power for activation of the disk array apparatus 100. The system power supply is a power supply of 12 V for supplying power for driving of the disk array apparatus 100. When the disk array apparatus 100 is in a standby state, the power supply units 101 and 102 function as the standby power supply so as to reduce power. When the disk array apparatus 100 performs a normal operation, the power supply units 101 and 102 function as the standby power supply and the system power supply. The power supply units 101 and 102 supply power from the external source to the backup units 103 and 104 for charging.

[1.1.1. At Occurrence of Power Outage]

When a power outage occurs and the power from the external source to the disk array apparatus 100 is interrupted, the power supply unit 101 notifies the CM 105 of the deenergization of the system power supply. The power supply unit 102 similarly notifies the CM 106 of the deenergization of the system power supply.

A control circuit 111 included in the CM 105 and a control circuit 117 included in the CM 106 determine whether the power from the external source to the power supply units 101 and 102 is interrupted. With the decrease in the voltage of the power supply units 101 and 102 for notifying CPUs 112 and 118 of a power outage state, respectively, the control circuits 111 and 117 receive power from the backup units 103 and 104, respectively. The backup units 103 and 104 supply power to the CMs 105 and 106, respectively.

The CM 105 saves data stored in a volatile memory 113 into a nonvolatile memory 115 with power supplied from the backup unit 103 at the occurrence of a power outage. The CM 106 similarly saves data stored in a volatile memory 119 into a nonvolatile memory 121 with power supplied from the backup unit 104 at the occurrence of a power outage.

[1.2. Backup Units 103 and 104]

The disk array apparatus 100 has the redundant configuration of the backup units 103 and 104. The backup unit 103 according to an embodiment supplies power to the CM 105, and supplies no power to the CM 106. The backup unit 104 according to an embodiment supplies power to the CM 106, and supplies no power to the CM 105. In the disk array apparatus 100 according to an embodiment, the backup units 103 and 104 supply a large amount of power to the CMs 105 and 106, respectively. That is, if a configuration in which both the backup units 103 and 104 supply power to each of the CMs 105 and 106 is used, the following problem arises. If one of the backup units 103 and 104 fails and cannot supply power to the CMs 105 and 106, the other one of the backup units 103 and 104 cannot supply sufficient power to both the CMs 105 and 106 at the same time. This leads to the shortage of power in both the CMs 105 and 106. The CMs 105 and 106 cannot therefore save data stored in the volatile memories 113 and 119 into the nonvolatile memories 115 and 121, respectively. Accordingly, in an embodiment, even if one of the backup units 103 and 104 fails, in order to supply power from the other one of the backup units 103 and 104 to a corresponding CM with certainty, the one-to-one connection between the backup unit 103 and the CM 105 and the one-to-one connection between the backup unit 104 and the CM 106 are established.

The backup units 103 and 104 are capacitors, can output a large amount of power at once, and can be recharged in a short time. More specifically, the disk array apparatus 100 can fully charge the backup units 103 and 104 within two minutes. The disk array apparatus 100 recharges the backup units 103 and 104 in this order. That is, the disk array apparatus 100 performs control processing so that the charging time of the backup unit 103 and the charging time of the backup unit 104 do not overlap each other. The reason for this is that, since the disk array apparatus 100 rapidly charges the backup units 103 and 104 that are capacitors, the overlap between the charging times of the backup units 103 and 104 may supply an excess current exceeding a permissible current from the power supply units 101 and 102 to each of the backup units 103 and 104. The disk array apparatus 100 may change the above-described order of charging the backup units 103 and 104.

If the disk array apparatus 100 charges a lead-acid battery, a nickel hydrogen battery, or a lithium-ion battery having the same electric capacity, it takes several hours to fully charge the lead-acid battery. Accordingly, by using a capacitor whose recharging time is shorter than that of the above-described secondary batteries as the backup units 103 and 104, the disk array apparatus 100 can markedly reduce the period of a write-through state.

[2. CMs 105 and 106]

The CM 105 according to an embodiment includes the control circuit 111, the central processing unit (CPU) 112, the volatile memory 113, a field programmable gate array (FPGA) 114, the nonvolatile memory 115, and a drive enclosure (DE) port 116. The CM 105 similarly includes the control circuit 117, the CPU 118, the volatile memory 119, an FPGA 120, the nonvolatile memory 121, and a DE port 122. More specifically, in an embodiment, the volatile memories 113 and 119 are cache memories, and the nonvolatile memories 115 and 121 are NAND flash memories.

The volatile memories 113 and 119 may not be cache memories, and may be any memories that lose stored data when the supply of power is stopped. The nonvolatile memories 115 and 121 may not be flash memories, and may be any memories that lose no stored data when the supply of power is stopped.

[2.1. Control Circuits 111 and 117]

During a normal operation, the external source supplies power to each of the control circuits 111 and 117 via the power supply units 101 and 102. The power supply units 101 and 102 function as a standby power supply and a system power supply. During a power outage, the external source cannot supply power to the power supply units 101 and 102. Accordingly, the backup units 103 and 104 supply power to the control circuits 111 and 119, respectively. An on-board unit (the control circuit 111, the CPU 112, the volatile memory 113, the FPGA 114, the nonvolatile memory 115, and the DE port 116) forming the CM 105 and an on-board unit (the control circuit 117, the CPU 118, the volatile memory 119, the FPGA 120, the nonvolatile memory 121, and the DE port 122) forming the CM 106 are connected to a power line, and receive power from the power line.

When a power outage occurs and the power from the external source to the disk array apparatus is interrupted, the standby power supply and the system power supply, which are formed by the power supply units 101 and 102, disappear. After a predetermined period has elapsed, the voltage of the power line drops below 12 V and the voltage of the CMs 105 and 106 therefore drops.

The power supply units 101 and 102 notify the CMs 105 and 106 of the deenergization of the system power supply, respectively. When a voltage in the CM 105 becomes equal to or less than 11 V and the voltage of the power supply units 101 and 102 for notifying the CPU 112 of a power outage state decreases, the control circuit 111 receives power from the backup units 103 and 104. Similarly, when a voltage in the CM 106 becomes equal to or less than 11 V and the voltage of the power supply units 101 and 102 for notifying the CPU 118 of a power outage state decreases, the control circuit 117 receives power from the backup units 103 and 104. When a voltage in the CMs 105 and 106 becomes equal to or less than a predetermined threshold value, the backup units 103 and 104 start to supply power. The threshold value can be changed in accordance with the amount of power by the disk array apparatus 100.

[2.2. CPUs 112 and 118]

The CPU 112 controls processing performed by the CM 105. The CPU 118 similarly controls processing performed by the CM 105. The CPU 112 performs control processing for writing data into the disks 107 to 110 upon receiving a writing instruction for the data from the host computer via the DE port 116. The CPU 112 determines which of the disks 107 to 110 is subjected to writing in accordance with the writing instruction transmitted from the host computer. Accordingly, the CPU 112 may write data into all of the disks 107 to 110 or some of them. Furthermore, the CPU 112 performs control processing for reading data from the disks 107 to 110 upon receiving a reading instruction for the data from the host computer via the DE port 116. The CPU 118 similarly performs control processing for writing data into the disks 107 to 110 upon receiving a writing instruction for the data from the host computer via the DE port 122. The CPU 118 determines which of the disks 107 to 110 is subjected to writing in accordance with the writing instruction transmitted from the host computer. Accordingly, the CPU 118 may write data into all of the disks 107 to 110 or some of them. Furthermore, the CPU 118 performs control processing for reading data from the disks 107 to 110 upon receiving a reading instruction for the data from the host computer via the DE port 122.

In an embodiment, there is a relationship of master and slave between the CMs 105 and 106, which form a redundant configuration. For example, the CM 105 operates as a master, and the CM 106 operates as a slave. When the CMs 105 and 106 operate normally, the CM 105 writes data into the disks 107 to 110 or read data from the disks 107 to 110. Subsequently, the CM 105 notifies the CM 106 of processed data and copies the processed data in the volatile memory 119 in synchronization with the CM 106.

When the CM 105 fails, the CPU 102 notifies the CPU 118 of the failure of the CM 105. The CM 106 performs writing of data in the disks 107 to 110 or reading of data from the disks 107 to 110.

Upon receiving from the control circuit 111 a notification that the disk array apparatus 100 is in a power outage state, the CPU 112 controls the saving of data stored in the volatile memory 113. The CPU 112 instructs a communication unit 201 in the FPGA 114 to save the data stored in the volatile memory 113 into the nonvolatile memory 115. Upon receiving from the control circuit 117 a notification that the disk array apparatus 100 is in the power outage state, the CPU 118 similarly controls the saving of data stored in the volatile memory 119. The CPU 118 instructs the communication unit 201 in the FPGA 120 to save the data stored in the volatile memory 119 into the nonvolatile memory 121. The CPU 112 controls the FPGA 114 so that the data stored in the volatile memory 113 is saved into the nonvolatile memory 115. The CPU 118 similarly controls the FPGA 120 so that the data stored in the volatile memory 119 is saved into the nonvolatile memory.

[2.3. Volatile Memories 113 and 119]

The volatile memory 113 temporarily stores data for which the host computer has issued a writing instruction or a reading instruction. When the writing of data in the volatile memory 113 is completed, the CM 105 transmits a completion response to the host computer. By having the volatile memory 113, the CM 105 can write the data stored in the volatile memory 113 into the disks 107 to 110 asynchronously with the operation of the host computer, that is, can perform a write-back operation. Thus, the CM 105 can perform high-speed data processing.

When the writing of data in the volatile memory 119 is completed, the CM 106 similarly transmits a completion response to the host computer. By having the volatile memory 119, the CM 106 can perform the write-back operation and can therefore perform high-speed data processing.

[2.4. FPGAs 114 and 120]

Figure 2:
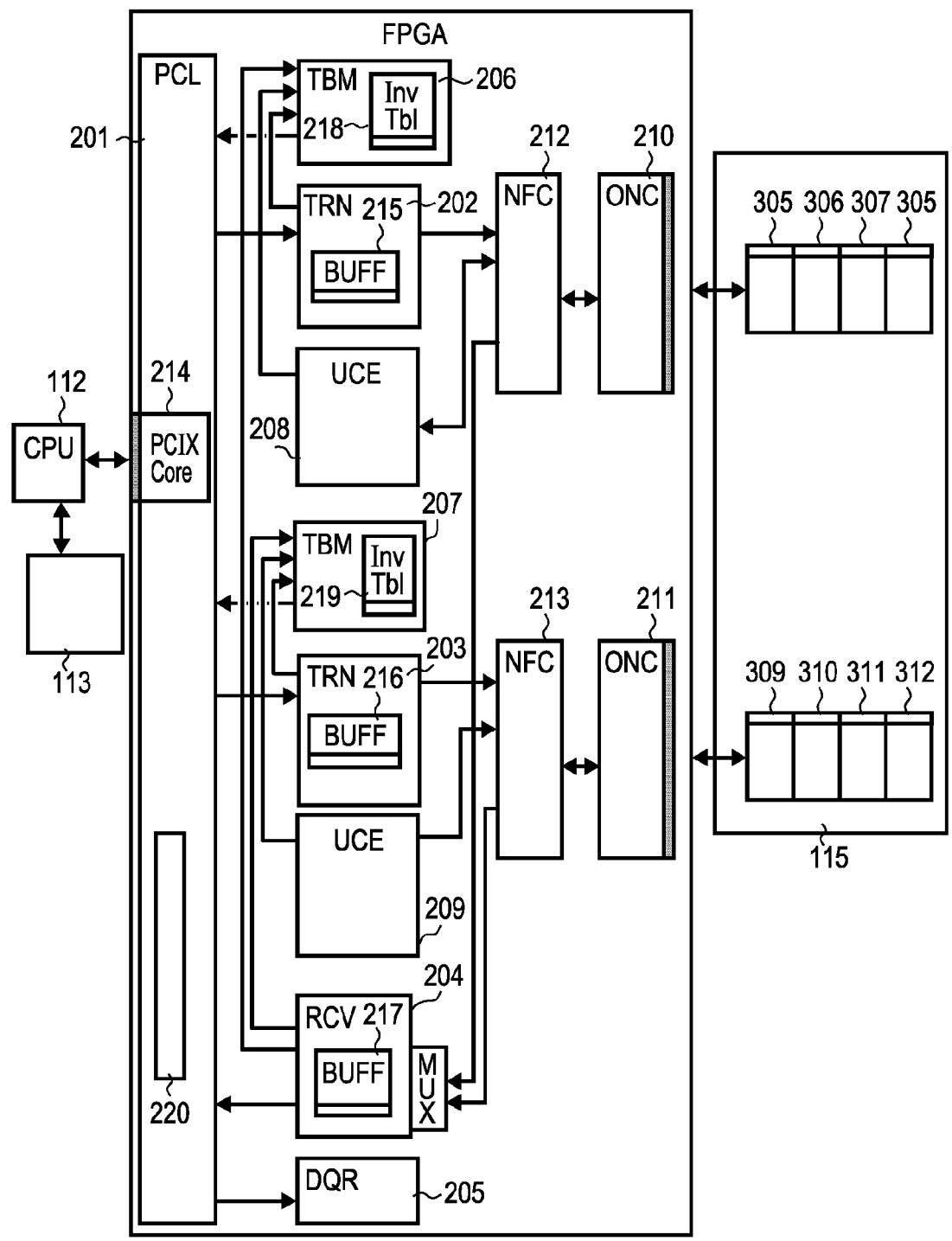
FIG. 2 is a block diagram of an FPGA 114 according to an embodiment.

FIG. 2 is a block diagram of the FPGA 114 according to an embodiment.

The FPGA 114 includes the communication unit (PCL) 201, data transfer units (TRNs) 202 and 203, a data write-back unit (RCV) 204, a communication information management unit (DQR) 205, table management units (TBMs) 206 and 207, transfer control units (UCEs) 208 and 209, memory control units (ONCs) 210 and 211, and data conversion control units (NFCs) 212 and 213. The FPGA 120 has a similar configuration. The hardware configuration of the FPGA 114 will be described below.

[2.4.1. Communication Unit (PCL) 201]

The communication unit 201 controls a PCI-X interface 214, and controls data transfer between the CPU 112 and the FPGA 114. The FPGA 114 transfers data to the CPU 112 using the PCI-X interface 214. The communication unit 201 detects an error generated in data transfer between the CPU 112 and the FPGA 114, and receives from the CPU 112 an instruction for saving data stored in the volatile memory 113 into the nonvolatile memory 115.

The communication unit 201 includes a register 220. The register 220 stores data to be processed by the FPGA 114, setting information of processing performed by the FPGA 114, etc. The FPGA 114 controls data transfer between the CPU 112 and the nonvolatile memory 115 with these pieces of data (the data to be processed by the FPGA 114, the setting information of processing performed by the FPGA 114, etc.). In an embodiment, the communication unit 201 controls the PCI-X interface 214, but may control another type of interface such as a PCI-express interface.

[2.4.2. Data Transfer Units (TRNs) 202 and 203]

When the source of power supplied to the CM 105 is switched from the external source to the backup unit 103, the data transfer units 202 and 203 perform control processing for transferring the data stored in the volatile memory 113 to the nonvolatile memory 115. The data transfer units 202 and 203 receive a data saving instruction from the CPU 112 via the communication unit 201, and perform the data transfer control processing.

The data transfer unit 202 includes a buffer 215. The data transfer unit 203 similarly includes a buffer 216. The data transfer unit 202 transfers the data stored in the volatile memory 113 to the data conversion unit 212 via the buffer 215. The data transfer unit 203 similarly transfers the data stored in the volatile memory 113 to the data conversion unit 213 via the buffer 216.

The data transfer unit 202 generates parity data and CRC data. The data transfer unit 203 similarly generates parity data and CRC data. The parity data is obtained by calculating the exclusive OR (EXOR) of seven pieces of Page data to be stored in the nonvolatile memory 115. The term "Page" refers to a unit used for management of data in the nonvolatile memory 115. The Page data is data in units of Pages. More specifically, the Page data is data stored in "Page" illustrated in FIG. 4. In an embodiment, the size of the Page data is 2 Kbytes.

The data transfer unit 202 receives the Page data from the CPU 112 via the PCI-X interface 214 and temporarily stores the Page data in the buffer 215. Subsequently, the data transfer unit 202 receives the next Page data from the CPU 112, obtains an intermediate result by calculating the exclusive OR of the Page data stored in the buffer 215 and the next Page data, and stores the intermediate result in the buffer 215. Furthermore, the data transfer unit 202 receives the Page data from the CPU 112, obtains a new intermediate result by calculating the exclusive OR of the page data and the intermediate result stored in the buffer 215, and updates the intermediate result stored in the buffer 215 with the new intermediate result. Thus, by calculating the exclusive OR of the Page data received by the data transfer unit 202 and the intermediate result, the data transfer unit 202 calculates the parity data that is the exclusive OR of seven pieces of Page data. The data transfer unit 203 calculates the parity data using a method similar to that used by the data transfer unit 202.

Furthermore, the data transfer unit 202 generates the CRC data used to check the consistency of four pieces of main data included in the Page data received from the CPU 112. The data transfer unit 203 similarly generates the CRC data used to check the consistency of four pieces of main data included in the Page data received from the CPU 112. In an embodiment, the size of the CRC data is 2 bytes. Data obtained by adding the CRC data to these pieces of main data is managed as the Page data. The CRC data is data that is generated by each of the data transfer units 202 and 203 for each piece of Page data, and indicates whether an error has occurred in the transfer of corresponding Page data. That is, the CRC data is data used to check the consistency of four pieces of main data included in the Page data. The structure of a Page 600 will be described in [2.5.3.1. Page 600] with reference to FIG. 6.

In an embodiment, the FPGA 114 includes two data transfer units, the data transfer units 202 and 203, so as to more rapidly save the data stored in the volatile memory 113 into the nonvolatile memory 115 in a shorter time.

Figure 11:
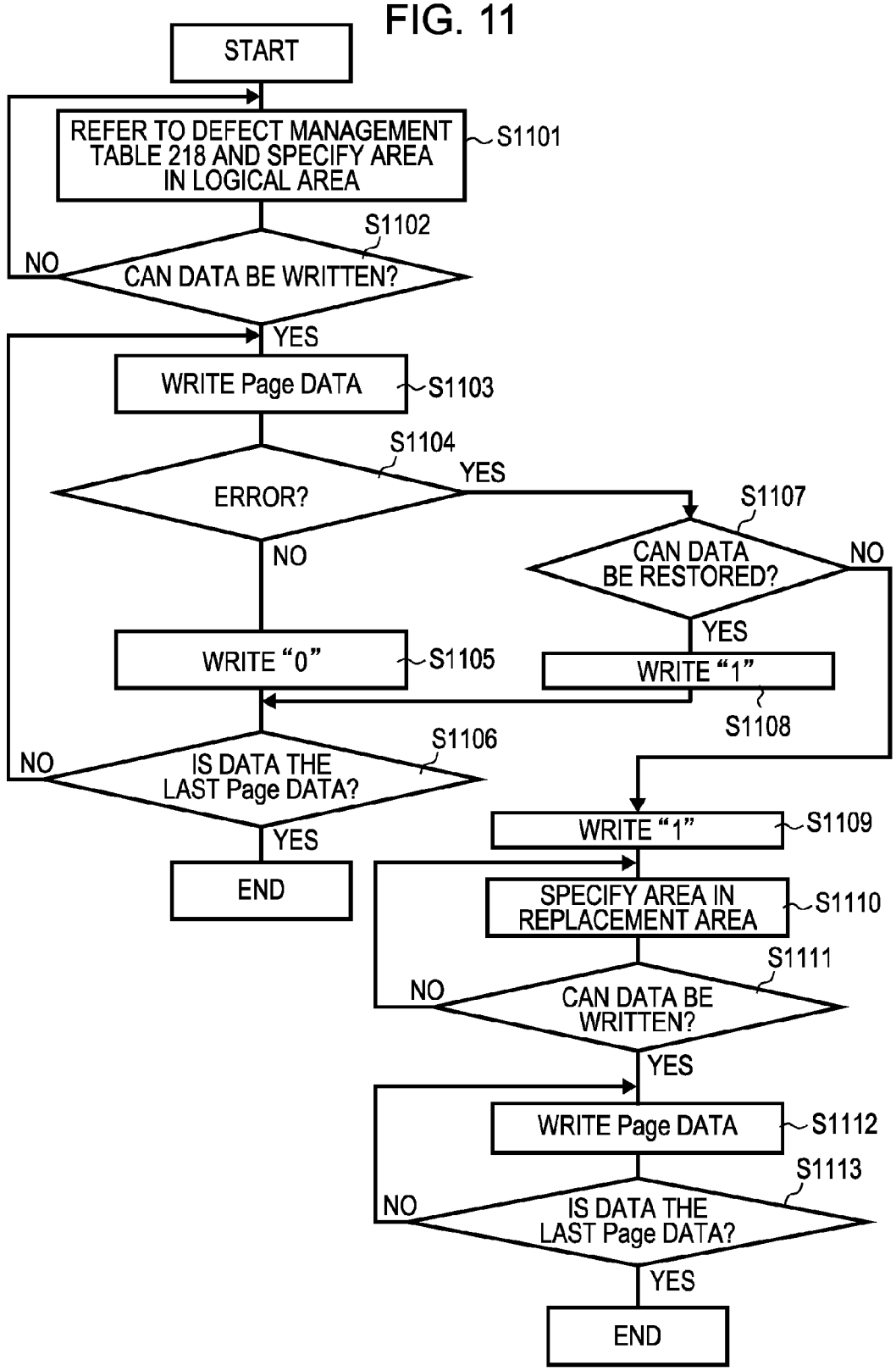
FIG. 11 is a flowchart illustrating a process performed by a data transfer unit 202 according to an embodiment.

FIG. 11 is a flowchart illustrating a process performed by the data transfer unit (TRN) 202 according to an embodiment.

The data transfer unit 202 reads out a transfer length and an address in a volatile memory from the communication information management unit 205 storing setting values. The data transfer unit 202 specifies an area in which data is written by referring to a pointer in a defect management table 218 stored in the table management unit 206 (step S1101). The area specified by the data transfer unit 202 is one of areas 0 to 585 in a logical area 1001 illustrated in FIG. 10.

The data transfer unit 202 determines whether data can be written in the area specified in step S1101 by referring to the defect management table 218 stored in the table management unit 206 (step S1102). The defect management table 218 is composed of a Dirty flag 901 and an Invalid flag 902. The Dirty flag 901 is used to determine whether there is an "error other than device (hardware) breakage" in each of 1024 "areas" in memory chips 301 and 302. The value "1" of the Dirty flag 901 indicates that there is an "error other than device (hardware) breakage", and the value "0" of the Dirty flag 901 indicates that there is no "error other than device (hardware) breakage". The "error other than device (hardware) breakage" means that, even if the FPGA 114 fails to perform data writing, the FPGA 114 may succeed in performing data writing at a subsequent retry.

The Invalid flag 902 is a flag used to determine whether there is an "error caused by device (hardware) breakage" in each of 1024 "areas" in the memory chips 301 and 302. The value "1" of the Invalid flag 902 indicates that there is an "error caused by device (hardware) breakage", and the value "0" of the Invalid flag 902 indicates that there is no "error caused by device (hardware) breakage". The "error caused by device (hardware) breakage" means that the FPGA 114 may not succeed in performing data writing at a subsequent retry. When the value of the Dirty flag 901 or the Invalid flag 902 corresponding to a specified area is "1", the data transfer unit 202 determines that data cannot be written in the specified area. When the values of the Dirty flag 901 and the Invalid flag 902 corresponding to the specified area are "0", the data transfer unit 202 determines that data can be written in the specified area.

When the data transfer unit 202 determines that data cannot be written in the specified area (No in step S1102), the data transfer unit 202 refers to the defect management table 218 again and specifies a new data writing area (step S1101). In an embodiment, the "next area" of the area that has been determined to be a non-writable area is specified. The "next area" is obtained by incrementing an AID representing the area that has been determined to be a non-writable area. In an embodiment, an area is represented by a "value", and increment means the addition of "1".

Figure 8:
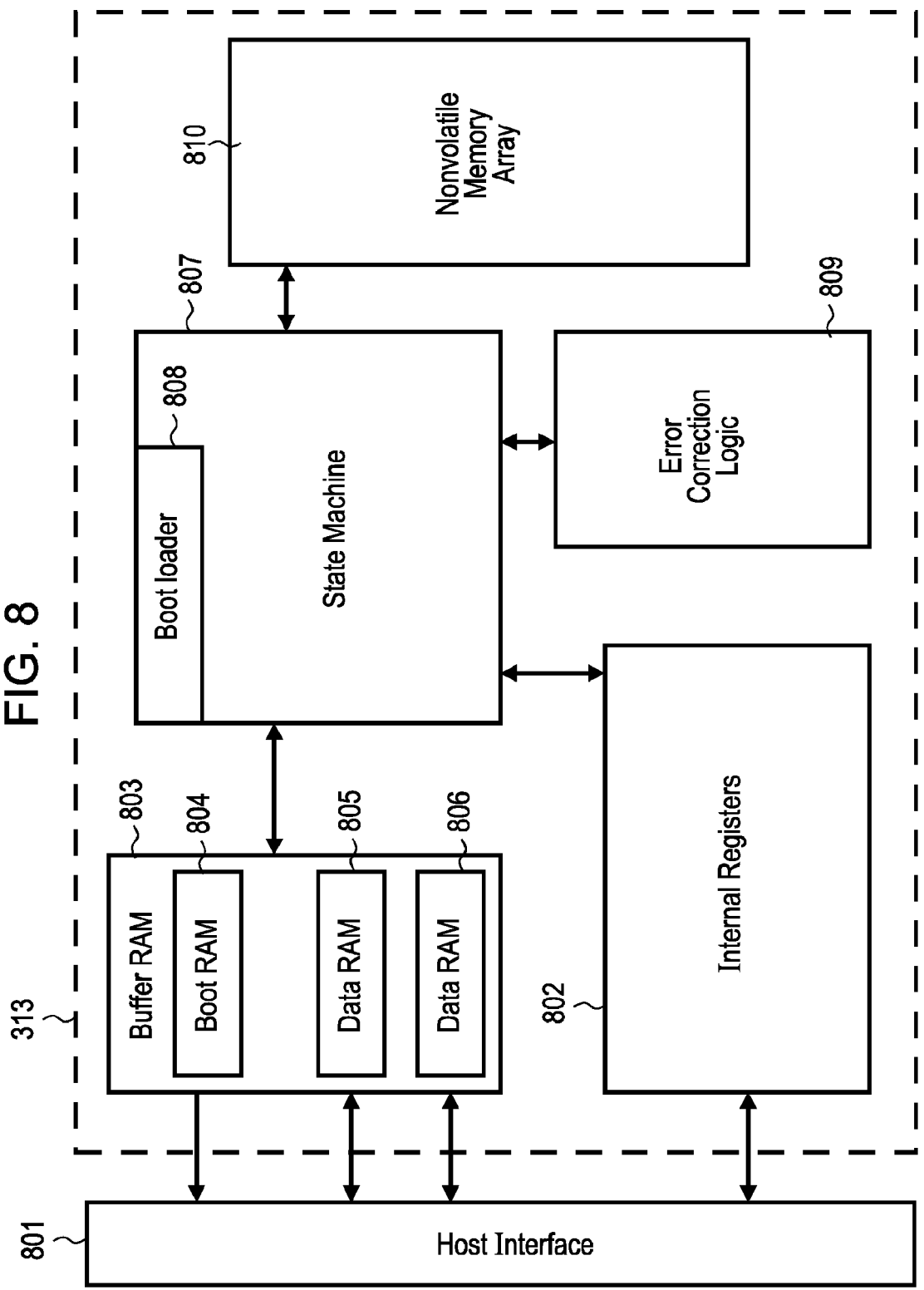
FIG. 8 is a diagram illustrating the hardware configuration of a Die 313 according to an embodiment.

When the data transfer unit 202 determines that data can be written in the specified area (Yes in step S1102), the data transfer unit 202 transfers data to the data conversion unit 212 via the buffer 215 and writes the data into the nonvolatile memory 115. In an embodiment, the data transfer unit 202 writes data into the volatile memory 115 in units of "Pages". That is, the data transfer unit 202 writes Page data into the specified area in the nonvolatile memory 115. More specifically, a state machine in each of Dies 313 to 320 stores Page data transferred from the data transfer unit 202 in a nonvolatile memory array. FIG. 8 is a diagram illustrating the detailed configuration of the Die 313. Each of the Dies 313 to 320 includes two data buffers (data buffers 805 and 806). The state machine forming each of the Dies 313 to 320 stores Page data transferred from the data transfer unit 202 in a nonvolatile memory array via these data buffers.

The data transfer unit 202 determines whether an error has occurred in the writing of the Page data (step S1104). The data transfer unit 202 determines whether an error has occurred by determining whether an error notification has been received from the state machine in each of the Dies 313 to 320. Furthermore, the data transfer unit 202 detects an error generated between the volatile memory 113 and the FPGA 114 by receiving an error notification from the communication unit 201.

When the data transfer unit 202 determines that "there is no error" (No in step S1104), the data transfer unit 202 sets the values of the Dirty flag 901 and the Invalid flag 902 corresponding to the specified area to "0" in the defect management table 218 (step S1105). At the start of writing of pieces of Page data in the specified area performed by the data transfer unit 202, the values of the Dirty flag 901 and the Invalid flag 902 corresponding to the specified area are "0". Accordingly, it is unnecessary to change the values of the Dirty flag 901 and the Invalid flag 902.

The data transfer unit 202 determines whether the Page data written in the nonvolatile memory 115 is the last Page data written in the specified area (step S1106). When the data transfer unit 202 determines that the written Page data is not the last Page data (No in step S1106), the data transfer unit 202 writes the next Page data in the specified area (step S1103). A region ("Page") in which the data transfer unit 202 writes the "next Page data" is a region ("Page") corresponding to a data buffer different from a data buffer used for the writing of the last Page data in the specified area. These data buffers are included in each of the Dies 313 to 320. When the data transfer unit 202 determines that the written Page data is the last Page data (Yes in step S1106), the process ends.

Figure 5:
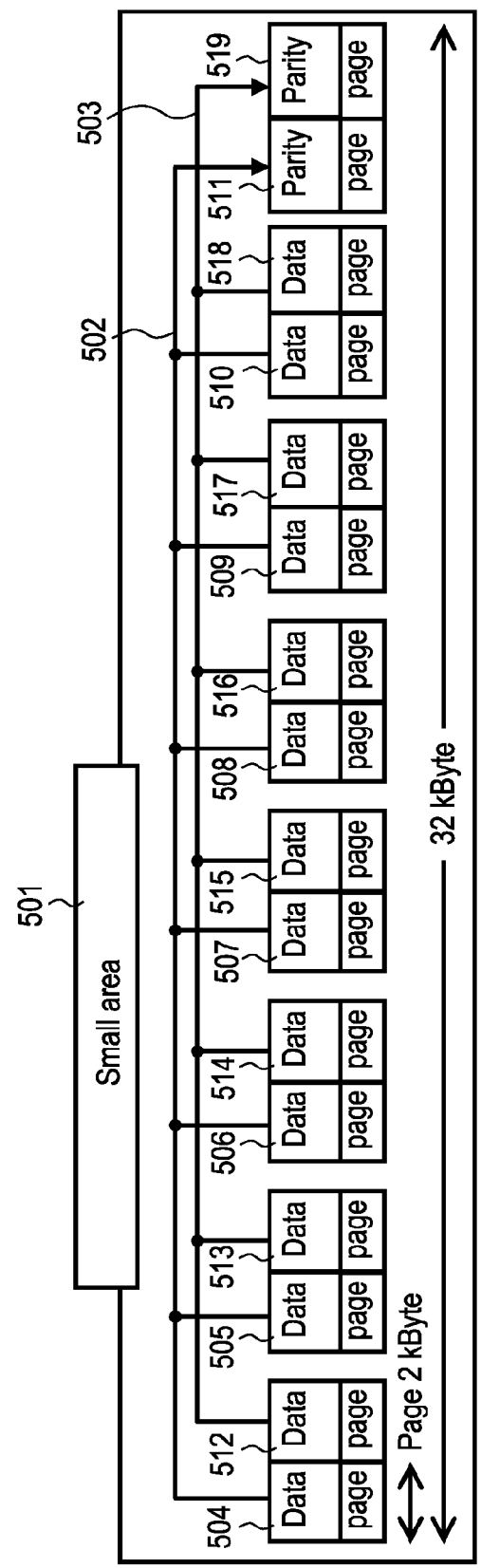
FIG. 5 is a diagram illustrating the configuration of a small area 501 in the nonvolatile memory 115 according to an embodiment.

When the data transfer unit 202 determines that "there is an error" in step S1106 (Yes in step S1104), the data transfer unit 202 further determines whether the error data can be restored (step S1107). The data transfer unit 202 determines whether the error data can be restored with the parity data and the CRC data. The data transfer unit 202 determines whether the error data can be restored by determining whether there is error data (another piece of Page data) in a stripe formed by pieces of Page data. FIG. 5 illustrates the exemplary detailed configurations of stripes 501 and 502. When the data transfer unit 202 determines that the error data can be restored (Yes in step S1107), the data transfer unit 202 does not need to write back again in another region (a replacement area 1002) the data that has started to be written in response to an instruction from the CPU 112 from the top of the data. That is, by causing the data transfer unit 202 to determine whether an error can be restored, it is unnecessary to set a region used for saving of the data including the restorable error in a replacement area. It is therefore possible to reduce the capacity of the replacement area 1002.

When the data transfer unit 202 determines that the error data can be resorted (Yes in step S1107), the data transfer unit 202 corrupts the CRC data and marks the restorable error. At that time, the data transfer unit 202 does not update the defect management table 218. The data transfer unit 202 updates the defect management table 218 when writing back data (step S1108). When the error is not an error caused by hardware breakage, the data transfer unit 202 sets the value of the Dirty flag 901 corresponding to the specified area to "1". When the error is an error caused by hardware breakage, the data transfer unit 202 sets the value of the Invalid flag 902 corresponding to the specified area to "1". The data transfer unit 202 determines whether the Page data is the last Page data (step S1106).

When the data transfer unit 202 determines that the error data cannot be resorted (No in step S1107), the data transfer unit 202 sets the Dirty flag 901 or the Invalid flag 902 corresponding to the specified area to "1" in the defect management table 218 in accordance with the above-described criteria (step S1109). The data transfer unit 202 specifies a new area in the replacement area 1002 (step S1110). The data transfer unit 202 determines whether data can be written in the area specified in step S1110 by referring to the defect management table 218 stored in the table management unit 206 (step S1111).

When the data transfer unit 202 determines that data cannot be written in the specified area (No in step S1111), the data transfer unit 202 specifies a new data writing area by referring to the defect management table 218 again (step S1110).

When the data transfer unit 202 determines that data can be written in the specified area (Yes in step S1111), the data transfer unit 202 transfers data to the data conversion unit 212 via the buffer 215 and writes the data into the nonvolatile memory 115 (step S1112). At that time, the data transfer unit 202 determines whether an error has occurred in writing of the Page data and performs a process similar to the process from step S1104 to S1109 (not illustrated). More specifically, when the data transfer unit 202 determines that "there is no error", the data transfer unit 202 sets the values of the Dirty flag 901 and the Invalid flag 902 corresponding to the specified area to "0". When the data transfer unit 202 determines that "there is an error", the data transfer unit 202 further determines whether the error data can be restored. When the data transfer unit 202 determines that the error data can be restored, the data transfer unit 202 corrupts the CRC data and marks the restorable error. At that time, the data transfer unit 202 does not update the defect management table 218. The data transfer unit 202 updates the defect management table 218 when writing back data. When the data transfer unit 202 determines that the error data cannot be restored, the data transfer unit 202 sets the value of the Dirty flag 901 or the Invalid flag 902 corresponding to the specified area to "1" in accordance with the above-described criteria. The data transfer unit 202 specifies an area in the replacement area 1002 again.

The data transfer unit 202 determines whether the Page data written in the nonvolatile memory 115 is the last Page data written in the specified area (step S1113). When the data transfer unit 202 determines that the written Page data is not the last Page data (No in step S1113), the data transfer unit 202 writes the next Page data in the specified area (step S1112). When the data transfer unit 202 determines that the written Page data is the last Page data (Yes in step S1113), the process ends.

[2.4.3. Data Write-back Unit (RCV) 204]

The data write-back unit 204 performs control processing for transferring data from the nonvolatile memory 115 to the volatile memory 113 at the time of restoration of power.

When power to the disk array apparatus 100 is restored, the CPU 112 instructs the FPGA 114 (more specifically, the data write-back unit 204 in the FPGA 114) to write back the data saved in the nonvolatile memory 115 to the volatile memory 113. The data write-back unit 204 receives an instruction from the CPU 112 and performs control processing for transferring data (from the nonvolatile memory 115 to the volatile memory 113).

The data write-back unit 204 includes a buffer 217. The data write-back unit 204 transfers the data stored in the nonvolatile memory 115 to the communication unit 201 via the buffer 217. The communication unit 201 transfers the data to the volatile memory 113 via the CPU 112.

The data write-back unit 204 detects the error of Page data that is received from the nonvolatile memory 115 via the memory control unit 210 and the data conversion control unit 212 or via the memory control unit 211 and the data conversion control unit 213. The data write-back unit 204 checks the consistency between the data written in the nonvolatile memory 115 by the data transfer units 202 and 203 and the data read by the data write-back unit 204 by checking the CRC data. When the data write-back unit 204 detects an error in checking the CRC data, the data write-back unit 204 determines whether the detected error data can be restored with parity data corresponding to the error data. When the data write-back unit 204 determines that the error data can be restored with the parity data, the data write-back unit 204 restores the error data with the parity data corresponding to the error data.

Here, the CRC data is data generated by each of the data transfer units 202 and 203 for each piece of Page data. The fact that the data write-back unit 204 detects an error in checking the CRC data means that there is no consistency between the data that has been read from the nonvolatile memory 115 by the data write-back unit 204 and the data that has been written in the nonvolatile memory 115 by the data transfer units 202 and 203.

[2.4.4. Communication Information Management Unit (DQR) 205]

The communication information management unit 205 stores communication information used for control processing performed by the data transfer units 202 and 203 and the data write-back unit 204. Each of the data transfer units 202 and 203 and the data write-back unit 204 reads out the communication information from the communication information management unit 205 and performs control processing.

The communication information is composed of a command issued for execution of processing, memory addresses in the volatile memory 113 and the nonvolatile memory 115, and the amount of data (transfer length) transferred between the volatile memory 113 and the nonvolatile memory 115 at a time.

The transfer length (the amount of data transferred at a time) is information that can be set by the FPGA 114 in consideration of the relationship between the volatile memory 113 and the nonvolatile memory 115.

Each of the data transfer units 202 and 203 and the data write-back unit 204 refers to the defect management table 218 or 219, and sequentially writes or reads data in regions. The AID is added to each "area" and is used to identify the "area". With the AID, it is possible to prevent "missing of a region accessed by the FPGA 114". The "missing of a region accessed by the FPGA 114" means that the order of regions accessed by each of the data transfer units 202 and 203 and the data write-back unit 204 is not an order set in advance. Each of the data transfer units 202 and 203 sets an AID initial value, generates an AID by incrementing the AID initial value in response to a command issued by the CPU 112, and stores the generated AID in a User region in the nonvolatile memory 115. The User region is similar to a User region 706 in a spare sector 700 illustrated in FIG. 7.

[2.4.5. Table Management Units (TBMs) 206 and 207]

The table management unit 206 controls the defect management table 218.

The FPGA 114 (the data transfer unit 202 and the data write-back unit 204) refers to the defect management table 218 so as to determine whether data can be written in or read from an "area".

In an embodiment, a region in which an error has occurred, which is managed with the defect management table 218, is identified by an "area". That is, when the FPGA 114 (the data transfer unit 202 and the data write-back unit 204) detects an error in the "area" in the nonvolatile memory 115 in which the FPGA 114 writes data in response to a single instruction transmitted from the CPU 112, the table management unit 206 writes in the defect management table 218 a flag indicating that there is an error in the region. The configuration of the "area" will be described in [2.5.2. Second Configuration of Nonvolatile Memory 115].

[2.4.5.1. Defect Management Table 218]

FIG. 9 illustrates an example of the defect management table 218 according to an embodiment.

The defect management table 218 is composed of the Dirty flag 901 and the Invalid flag 902. The table management unit 206 manages 1024 "areas" in the memory chips 301 and 302 with the defect management table 218.

The Dirty flag 901 is used to determine whether there is the "error other than device (hardware) breakage" in each of the 1024 "areas" in the memory chips 301 and 302. The value "1" of the Dirty flag 901 indicates that there is the "error other than device (hardware) breakage". The value "0" of the Dirty flag 901 indicates that there is no "error other than device (hardware) breakage". The "error other than device (hardware) breakage" means that, even if the FPGA 114 fails to perform data writing, the FPGA 114 may succeed in performing data writing at a subsequent retry.

The Invalid flag 902 is used to determine whether there is an "error caused by device (hardware) breakage" in each of the 1024 "areas" in the memory chips 301 and 302. The value "1" of the Invalid flag 902 indicates that there is the "error caused by device (hardware) breakage", and the value "0" of the Invalid flag 902 indicates that there is no "error caused by device (hardware) breakage". The "error caused by device (hardware) breakage" means that the FPGA 114 may not succeed in performing data writing at a subsequent retry.

The table management unit 207 similarly controls a defect management table 219 describing a region in the nonvolatile memory 115 in which a data reading error or a data writing error has occurred. The table management unit 207 manages the 1024 "areas" in memory chips 303 and 304 with the defect management table 219. The defect management table 219 is composed of a Dirty flag corresponding to the Dirty flag 901 and an Invalid flag corresponding to the Invalid flag 902.

[2.4.6. Transfer Control Units (UCEs) 208 and 209]

Each of the transfer control units 208 and 209 controls the issue of a command (CMD) to the nonvolatile memory 115. In an embodiment, the number of transfer control units is two, the transfer control units 208 and 209, and is the same as the number of buses for transferring data to the nonvolatile memory 115.

At the time of a power outage, the transfer control unit 208 writes the defect management table 218 stored in the table management unit 206 into the nonvolatile memory 115. At the time of a power outage, the transfer control unit 209 similarly writes the defect management table 218 stored in the table management unit 207 into the nonvolatile memory 115.

A region in the nonvolatile memory 115 into which the transfer control units 208 and 209 write the defect management tables 218 and 219, respectively, is guaranteed to have a larger number of times of data writing than other regions.

At the time of restoration of power, the transfer control unit 208 performs control processing for reading out the defect management table 218 stored in the nonvolatile memory 115 into the table management unit 206. At the time of restoration of power, the transfer control unit 209 similarly performs control processing for reading out the defect management table 219 stored in the nonvolatile memory 115 into the table management unit 207.

[2.4.7. Memory Control Units (ONCs) 210 and 211]

Each of the memory control units 210 and 211 controls an interface for the nonvolatile memory 115. Each of the memory control units 210 and 211 performs writing of data in the nonvolatile memory 115 and reading of data from the nonvolatile memory 115 by controlling the processing of the nonvolatile memory 115.

[2.4.8. Data Conversion Control Units (NFCs) 212 and 213]

Each of the data conversion control units 212 and 213 performs IP control for the nonvolatile memory 115. Each of the data conversion control units 212 and 213 performs processing for maintaining the consistency between data stored in the volatile memory 113 and data stored in the nonvolatile memory 115. Upon receiving data from the data transfer unit 202, the data conversion control unit 212 converts the data into a format that can be stored in the nonvolatile memory 115, and transfers the converted data to the memory control unit 210. Upon receiving data from the memory control unit 210, the data conversion control unit 212 converts the data into a format that can be stored in the volatile memory 113, and transfers the converted data to the data write-back unit 204. Upon receiving data from the data transfer unit 203, the data conversion control unit 213 similarly converts the data into a format that can be stored in the nonvolatile memory 115, and transfers the converted data to the memory control unit 211. Upon receiving data from the memory control unit 211, the data conversion control unit 213 similarly converts the data into a format that can be stored in the volatile memory 113, and transfers the converted data to the data write-back unit 204.

[2.5. Nonvolatile Memories 115 and 121]

Next, the nonvolatile memories 115 and 121 according to an embodiment in which data stored in the volatile memory 113 is saved will be described.

The FPGA 114 according to an embodiment saves data stored in the volatile memory 113 into the nonvolatile memory 115 in response to an instruction transmitted from the CPU 112. The FPGA 120 saves data stored in the volatile memory 119 into the nonvolatile memory 121 in response to an instruction transmitted from the CPU 118.

The nonvolatile memory 115 is a storage medium for storing data stored in the volatile memory 113 for saving at the time of a power outage. The nonvolatile memory 121 is a storage medium for storing data stored in the volatile memory 119 for saving at the time of a power outage. The nonvolatile memory 115 is connected to the FPGA 114. The volatile memory 113 and the FPGA 114 are connected to the CPU 112. The nonvolatile memory 115 has a defect management table. A region in the nonvolatile memory 115 in which the defect management table is stored is guaranteed to have a larger number of times of data writing than other regions. The region in the nonvolatile memory 115 in which the defect management table is stored is a "Block 0" illustrated in FIG. 4. The data transfer unit 202 transfers the defect management table 218 stored in the table management unit 206 to the nonvolatile memory 115, and the defect management table 218 is stored in the "Block 0" in the memory chips 301 and 302. The data transfer unit 203 similarly transfers the defect management table 219 stored in the table management unit 207 to the nonvolatile memory 115, and the defect management table 219 is stored in the "Block 0" in the memory chips 303 and 304.

The nonvolatile memory 121 is connected to the FPGA 120. The volatile memory 119 and the FPGA 120 are connected to the CPU 118. The nonvolatile memory 119 has a defect management table. The configuration of the nonvolatile memory 121 is similar to that of the nonvolatile memory 115. The configuration of the nonvolatile memory 115 will be described in detail below.

[2.5.1. First Configuration of Nonvolatile Memory 115]

Figure 3:
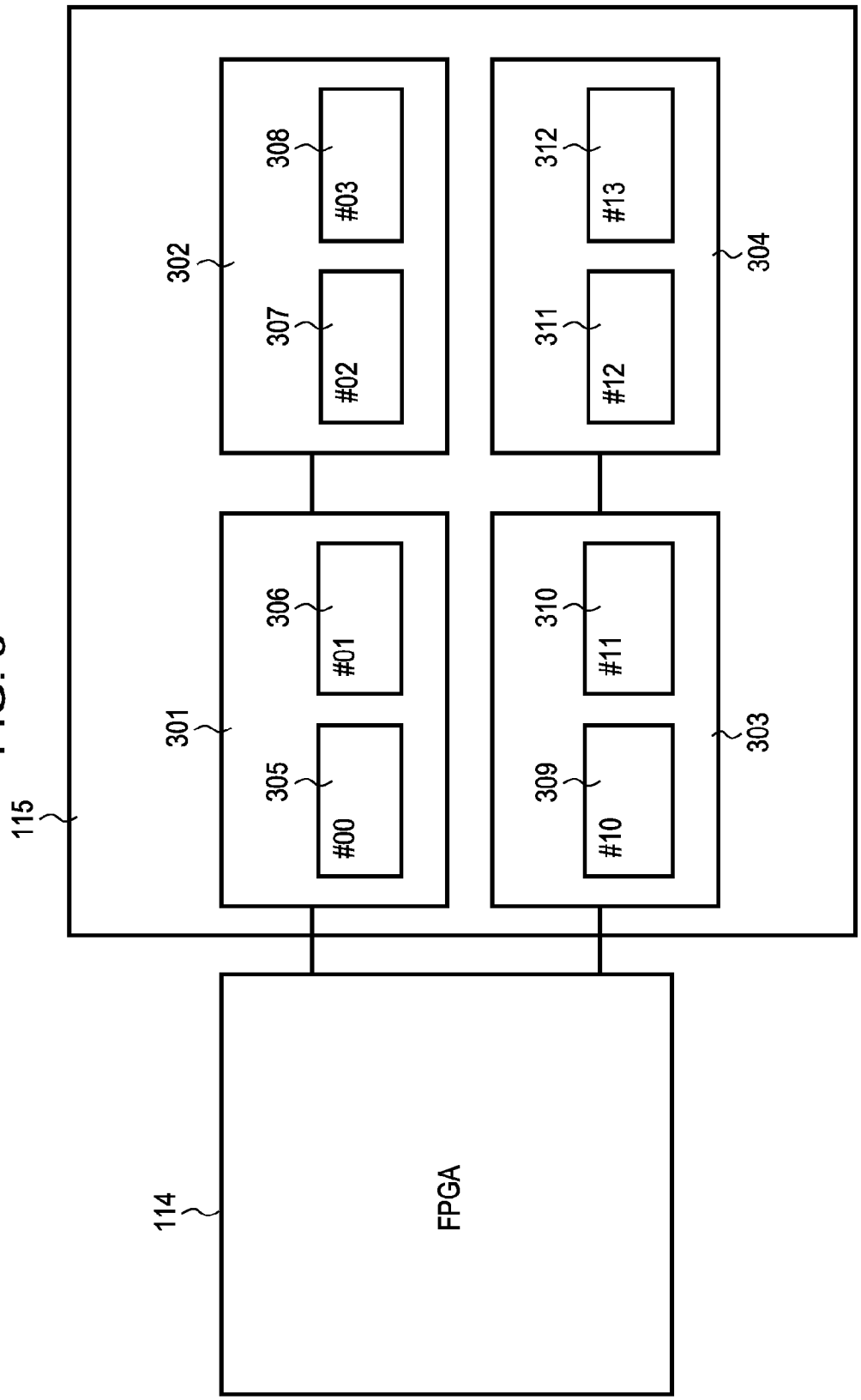
FIG. 3 is a diagram illustrating the configuration of a nonvolatile memory 115 according to an embodiment.

FIG. 3 is a diagram illustrating the configuration of the nonvolatile memory 115 according to an embodiment.

The nonvolatile memory 115 includes the memory chips 301, 302, 303, and 304. Data stored in the nonvolatile memory 115 is divided and managed in the memory chips 301, 302, 303, and 304.

The memory chip 301 is composed of Banks 305 and 306. The memory chip 302 is composed of Banks 307 and 308. The memory chip 303 is composed of Banks 309 and 310. The memory chip 304 is composed of Banks 311 and 312.

Figure 4:
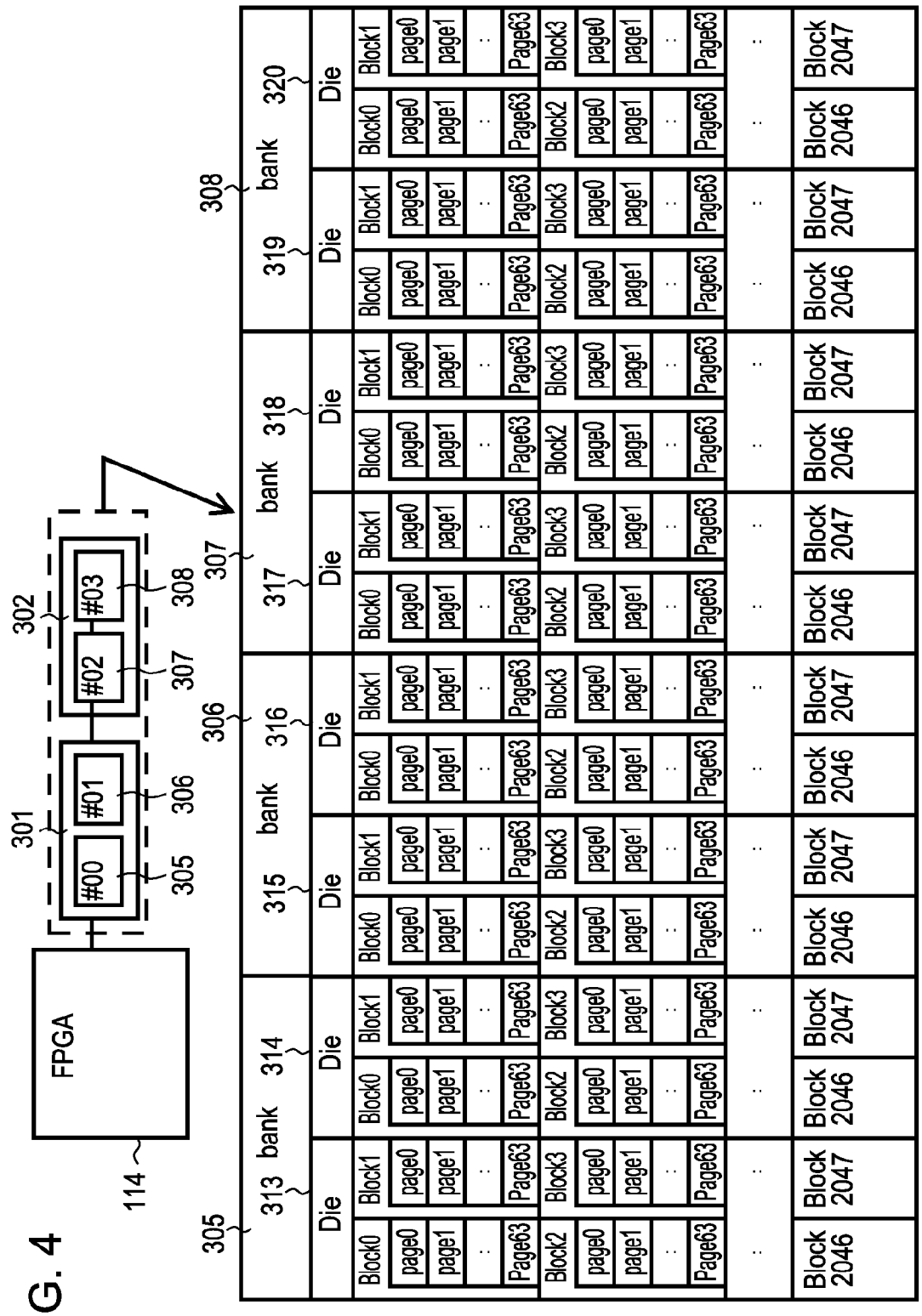
FIG. 4 is a diagram illustrating details of Banks 305 to 308 in the nonvolatile memory 115 according to an embodiment.

Data stored in the nonvolatile memory 115 is divided and managed in the Banks 305 to 312. The detailed configuration of a part (the memory chips 301 and 302: the Banks 305 to 308) of the nonvolatile memory 115 will be described below with reference to FIG. 4. FIG. 4 is a diagram illustrating the details of the Banks 305 to 308 in the nonvolatile memory 115 according to an embodiment. The configuration of the memory chips 303 and 304 (the Banks 309 to 312) is the same as that of the memory chips 301 and 302 (the Banks 305 to 308).

Figure 6:
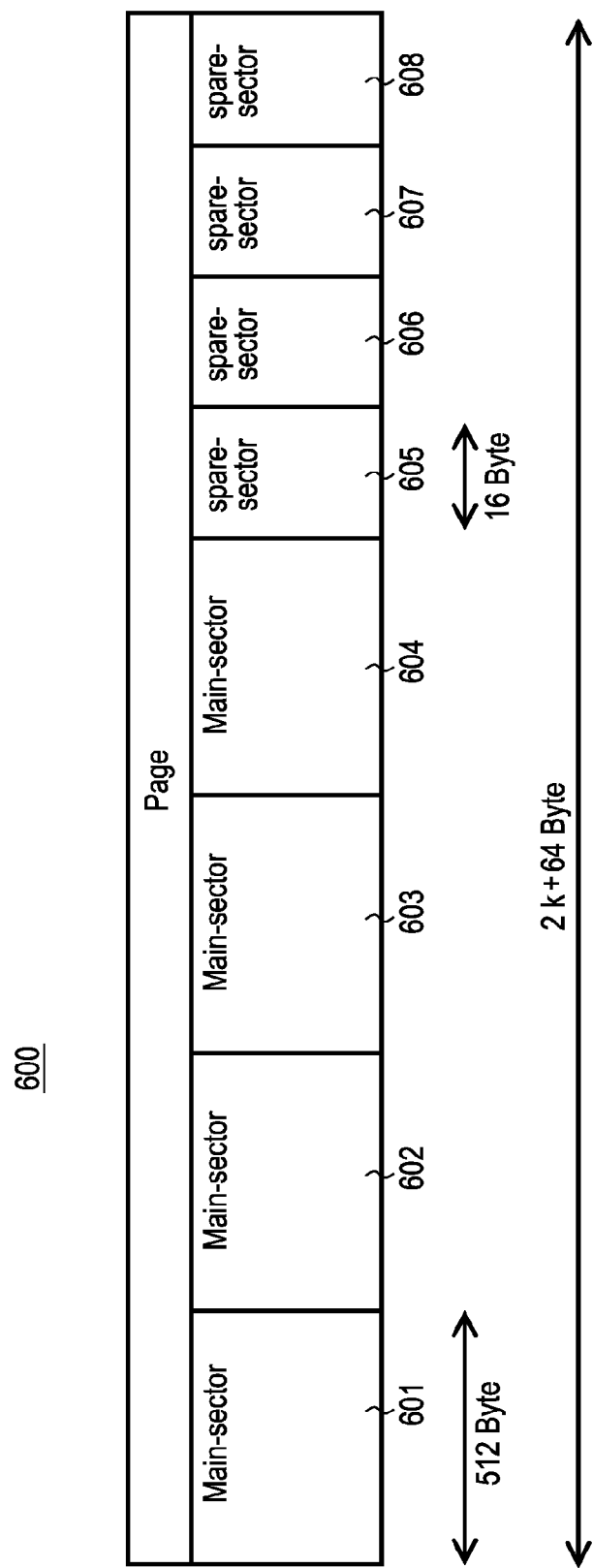
FIG. 6 is a diagram illustrating the configuration of a Page 600 according to an embodiment.

The Bank 305 is composed of Dies 313 and 314. The Die 313 is composed of 2048 Blocks, Blocks 0 to 2047. The Die 314 is also composed of 2048 Blocks, the Blocks 0 to 2047. Each of the Blocks 0 to 2047 in the Dies 313 and 314 is composed of 64 Pages, Pages 0 to 63. The "Die", the "Block", and the "Page" are units of data storage region. The "Die" is a unit of storage of data in the nonvolatile memory 115 (a unit of hardware configuration), and the "Dies" are physically separated from each other. In an embodiment, the size of the "Page" is 2 Kbytes. FIG. 6 is a diagram illustrating the hardware configuration of the Die 313. A nonvolatile memory array 810 in the Die 313 corresponds to the 2048 "Blocks", the Blocks 0 to 2047" illustrated in FIG. 4. Accordingly, the nonvolatile memory 115 has 16 nonvolatile memory arrays. Since each of the Dies 313 to 320 has two data buffers (for example, the data buffers 805 and 806 illustrated in FIG. 6), the nonvolatile memory 115 has 32 data buffers. A state machine 807 in the Die 313 stores data (Page data) transferred from the FPGA 114 in the nonvolatile memory array 810. Each of other Dies, the Dies 314 to 320, has a state machine, and the state machine stores data (Page data) transferred from the FPGA 114 in a corresponding nonvolatile memory array.

The Bank 306 is composed of Dies 315 and 316. Each of the Dies 315 and 316 is composed of 2048 Blocks, the Blocks 0 to 2047. Each of the Blocks 0 to 2047 in the Dies 315 and 316 is composed of 64 Pages, the Pages 0 to 63.

The Bank 307 is composed of Dies 317 and 318. Each of the Dies 317 and 318 is composed of 2048 Blocks, the Blocks 0 to 2047. Each of the Blocks 0 to 2047 in the Dies 317 and 318 is composed of 64 Pages, the Pages 0 to 63.

The Bank 308 is composed of Dies 319 and 320. Each of the Dies 319 and 320 is composed of 2048 Blocks, the Blocks 0 to 2047. Each of the Blocks 0 to 2047 in the Dies 319 and 320 is composed of 64 Pages, the Pages 0 to 63.

[2.5.2. Second Configuration of Nonvolatile Memory 115]

The configuration of the nonvolatile memory 115 when the FPGA 114 writes data into the nonvolatile memory 115 will be described. A part (the memory chips 301 and 302) of the nonvolatile memory 115 is composed of 1024 "areas". That is, the nonvolatile memory 115 is composed of 2048 "areas". The "area" is a region in the nonvolatile memory 115 in which the FPGA 114 writes data in response to a single instruction transmitted from the CPU 112. The FPGA 114 identifies and manages the "areas" using the defect management tables 218 and 219.

In an embodiment, each "area" is composed of 16 "Blocks". The 16 "Blocks" individually store pieces of data via the 16 data buffers (for example, the data buffers 805 and 806 illustrated in FIG. 6) provided in the memory chips 301 and 302 (the Dies 313 to 320) in the nonvolatile memory 115. That is, each "area" stores a predetermined amount of data transferred to the nonvolatile memory 115 via different data buffers provided in the nonvolatile memory 115. The FPGA 114 controls the transfer of data from the volatile memory 113 to the nonvolatile memory 115 in units of "areas". In an embodiment, the CPU 112 instructs the FPGA 114 to perform data transfer in units of "areas".

The "areas" in the nonvolatile memory 115 are divided into a "logical area" and a "replacement area".

Figure 10:
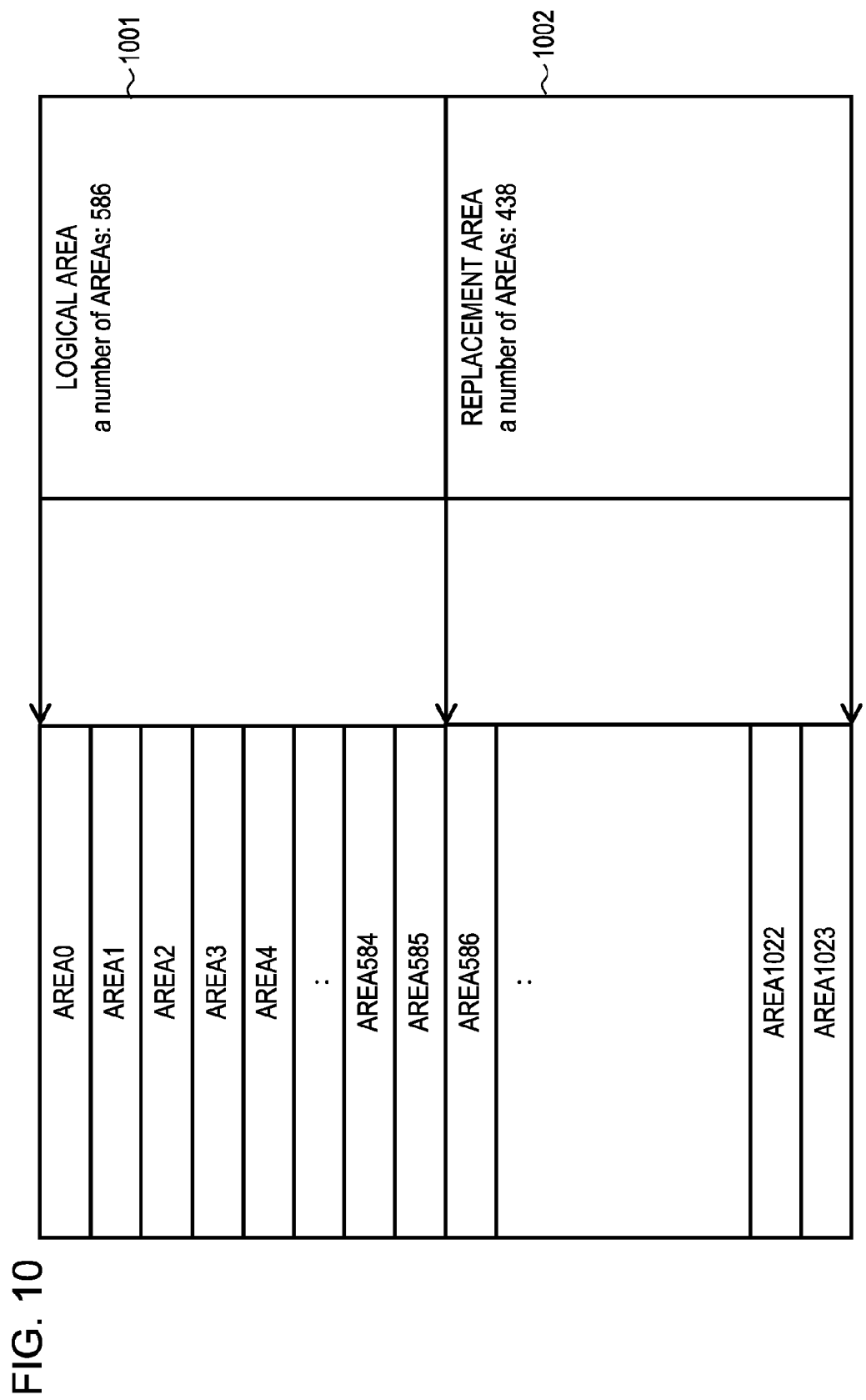
FIG. 10 is a schematic diagram illustrating areas 0 to 1023 according to an embodiment.

FIG. 10 is a schematic diagram illustrating the "areas 0 to 1023" in the memory chips 301 and 302 in the nonvolatile memory 115. In an embodiment, the logical area 1001 is composed of the areas 0 to 585, and the replacement area 1002 is composed of the areas 586 to 1023. The memory chips 303 and 304 are also composed of a logical area and a replacement area.

The FPGA 114 saves (transfers) data stored in the volatile memory 113 into (to) the logical area 1001 in the nonvolatile memory 115. When error data occurs in the process of writing of data in a specific one of the areas (the areas 0 to 585) in the logical area 1001 and the FPGA 114 determines that the error data cannot be restored, the FPGA 114 rewrites the data in one of the areas 586 to 1023 in the replacement area 1002. The FPGA 114 determines whether error data can be restored with parity data generated by the FPGA 114. As described previously in [2.4.2. Data Transfer Units (TRNs) 202 and 203], each of the data transfer units 202 and 203 in the FPGA 114 generates parity data.

The FPGA 114 similarly writes stored data in "areas" in the memory chips 303 and 304 in the volatile memory 113 in accordance with data writing criteria used when data is written in the "areas 0 to 1023" in the memory chips 301 and 302. The "data writing criteria" mean that, "when it is determined that error data cannot be restored, the error data is rewritten in a replacement area."

[2.5.3. Small Area 501]

FIG. 5 is a diagram illustrating the configuration of the small area 501 in the nonvolatile memory 115 according to an embodiment.

The small area 501 is composed of 16 "Pages". The size of the small area 501 is 32 Kbytes. Each "area" in the nonvolatile memory 115 is composed of 64 small areas (for example, the small area 501).

Pieces of Page data 504 to 510 and parity data 511 form the stripe 502, and pieces of Page data 512 to 518 and parity data 519 form a stripe 503. The stripe 502 is composed of the pieces of Page data 504 to 510 and the parity data 511. The stripe 503 is composed of the pieces of Page data 512 to 518 and the parity data 519.

The stripe 502 has a so-called (7+1) configuration of RAID5 with the pieces of Page data 504 to 510 and the parity data 511. The stripe 502 is composed of the pieces of Page data 504 to 510, which are stored in the "Pages" in a region (the "area") in the nonvolatile memory 115 in which the FPGA 114 writes data in response to a single instruction transmitted from the CPU 112, and the parity data 511. Furthermore, the stripe 502 forms RAID5 with Page data stored in a predetermined "Page" in each of the "Dies 313 to 320" that are physically separated from each other. That is, the "Pages" that individually store the pieces of Page data 504 to 510 and the parity data 511 in the stripe 502 are physically separated from each other (from the viewpoint of hardware configuration).

Here, a case in which a stripe is formed by pieces of Page data stored in "Pages" in the same piece of hardware will be considered. The probability that two or more of the pieces of Page data 504 to 510 and the parity data 511 in the stripe 502 are errors is lower than the probability that two or more pieces of Page data are errors in such a stripe. The reason for this is that the "Pages" that individually store the pieces of Page data 504 to 510 and the parity data 511 are physically separated from each other.

In particular, when the nonvolatile memory 115 is a NAND flash memory, an error such as a data writing error easily occurs in each of Dies that are physically separated from each other. Accordingly, it is useful to form a RAID5 stripe with pieces of Page data stored in "Pages" belonging to different "Dies" as described previously.

The pieces of Page data 504 to 510 and the parity data 511 in the stripe 502 are transferred via a plurality of different data buffers in the nonvolatile memory 115.

The stripe 503 has the (7+1) configuration of RAID5 with the pieces of Page data 512 to 518 and the parity data 519. The stripe 503 is composed of the pieces of Page data 512 to 518, which are stored in the "Pages" in a region (the "area") in the nonvolatile memory 115 in which the FPGA 114 writes data in response to a single instruction transmitted from the CPU 112, and the parity data 519. Furthermore, the stripe 503 forms RAID5 with Page data stored in a predetermined "Page" in each of the "Dies 313 to 320" that are physically separated from each other.

[2.5.3.1. Page 600]

FIG. 6 is a diagram illustrating the configuration of the Page 600 according to an embodiment. The Page 600 is the same as each of the "Pages" illustrated in FIGS. 4 and 5, and is a region in the nonvolatile memory 115. The Page 600 is composed of main sectors 601 to 604 and spare sectors 605 to 608.

Each of the main sectors 601 to 604 stores main data representing user information of Page data. In an embodiment, four pieces of main data are stored in the Page 600. The size of each piece of main data is 512 bytes. Each of the spare sectors 605 to 608 stores spare data about the consistency of main data. In an embodiment, four pieces of spare data are stored in the Page 600. The size of each piece of spare data is 16 bytes.

[2.5.3.2. Spare Sector 700]

Figure 7:
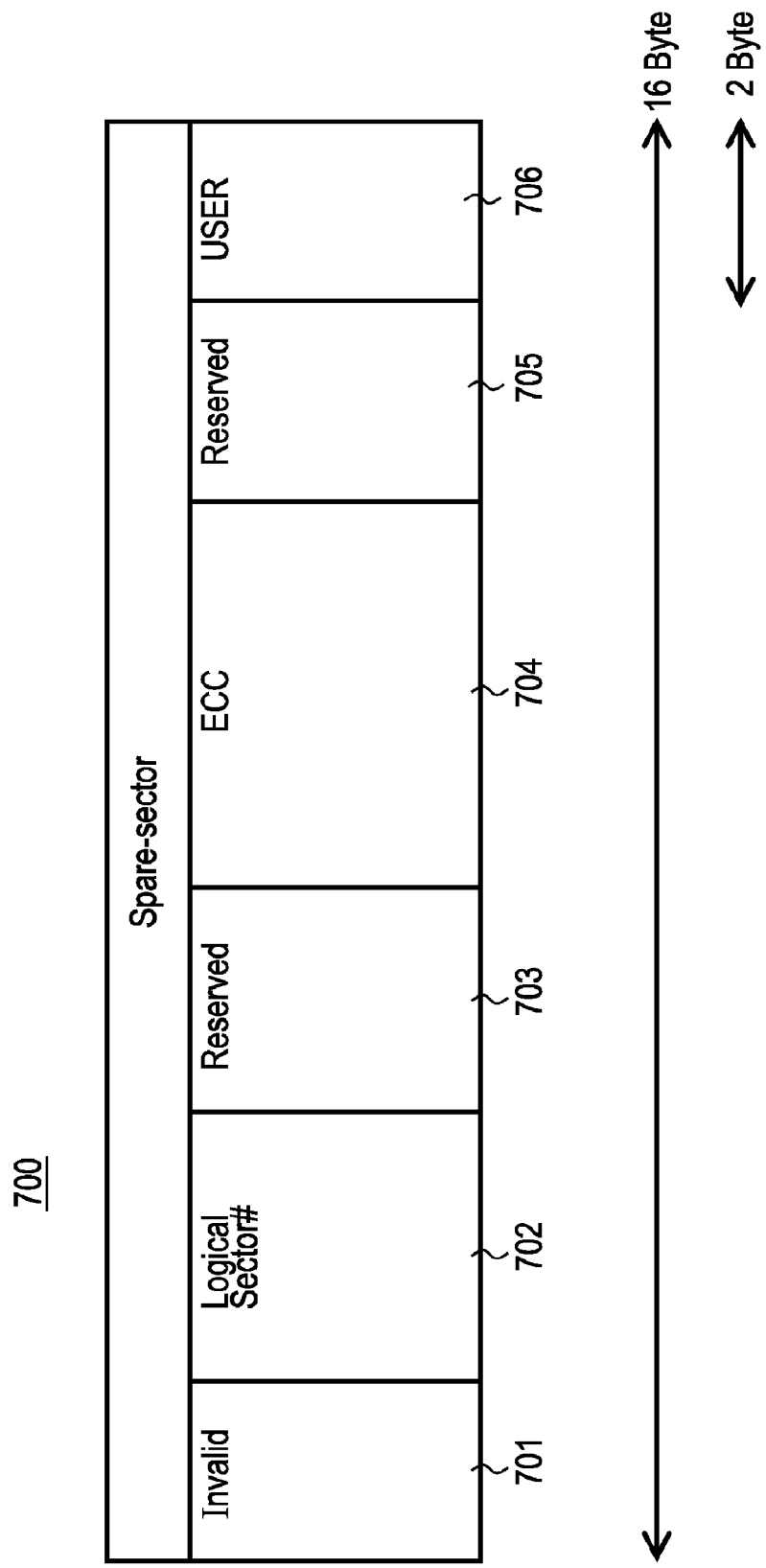
FIG. 7 is a diagram illustrating the configuration of a spare sector 700 according to an embodiment.

FIG. 7 is a diagram illustrating the configuration of the spare sector 700 according to an embodiment. The spare sector 700 is the same as the spare sectors 605 to 608 illustrated in FIG. 6, and is a region in the nonvolatile memory 115. The spare sector 700 is composed of an Invalid region 701, a Logical sector 702, Reserve regions 703 and 705, an ECC region 704, and the User region 706.

The Invalid region 701 stores information indicating whether a main sector corresponding to the spare sector 700 is defective in shipment from the factory.

The Logical sector 702 stores information for identifying the spare sector 700. The Reserve regions 703 and 705 are spare available regions. The ECC region 704 stores ECC data generated in the nonvolatile memory 115. The ECC data is used to correct the bit error of main data. The User region 706 stores CRC data or AID data.

[2.5.4. Dies 313 to 320]

FIG. 8 is a diagram illustrating the hardware configuration of the Die 313 according to an embodiment. The configuration of other Dies, the Dies 314 to 320, is the same as that of the Die 313.

The Die 313 corresponds to a portion surrounded by a dotted line in FIG. 8. The Die 313 transfers data to the FPGA 114 via a host interface 801.

The Die 313 includes a register (internal register) 802, a buffer memory (buffer RAM) 803, the state machine 807, an error correction circuit (error correction logic) 809, and the nonvolatile memory array 810. The buffer memory 803 is composed of a boot buffer (boot RAM) 804 and the data buffers (data RAMs) 805 and 806. The state machine 807 stores a boot loader 808. The boot loader 808 is a control program that is read from the register 802 into the state machine 807 to activate the Die 313 when the Die 313 starts data transfer control.

The register 802 stores an address, a command, and a configuration data (setting information). The state machine 807 reads out the address, the command, and the configuration data from the register 802 and performs transfer control. The address is the address of data in the nonvolatile memory array 810. The command is issued by the Die 313 when the Die 313 performs the data transfer control.

The nonvolatile memory array 810 is composed of the 2048 "Blocks" illustrated in FIG. 4, and is a data storage unit. The Die 313 stores data in the Blocks 0, 2, 4, 6, . . . , and 2046 illustrated in FIG. 4 (a part of the nonvolatile memory array 810) via the data buffer 805. The Die 313 stores data in the Blocks 1, 3, 5, 7, . . . , and 2047 illustrated in FIG. 4 via the data buffer 806. Thus, the Die 313 stores data in even-numbered Blocks via the data buffer 805, and stores data in odd-numbered Blocks via the data buffer 806.

The Die 313 stores data in the nonvolatile memory array 810 with two buffers, the data buffers 805 and 806. The Die 313 stores data in the data buffers 805 and 806 in units of "Pages" illustrated in FIG. 4. The state machine 807 in the Die 313 transfers data to the nonvolatile memory array 810 via the data buffers 805 and 806. That is, the Die 313 transfers data to the nonvolatile memory array 810 via the data buffers 805 and 806 in units of "Pages".

The state machine 807 transfers data to the nonvolatile memory array 810 via the data buffer 805 and then stores the next data to be transferred to the nonvolatile memory array 810 in the data buffer 806. As a result, the Die 313 can effectively store data in the nonvolatile memory array 810. "The next data to be transferred to the nonvolatile memory array 810" is "data which the state machine 807 transfers to the nonvolatile memory array 810 after completing the transfer of data stored in the data buffer 805 to the nonvolatile memory array 810." The state machine 807 transfers data to the nonvolatile memory array 810 via the data buffer 806 and then stores data to be transferred to the nonvolatile memory array 810 in the data buffer 805.

Each of other Dies, the Dies 314 to 320, includes data buffers corresponding to the data buffers 805 and 806 and a nonvolatile memory array corresponding to the nonvolatile memory array 810, and transfers data to the nonvolatile memory array with the data buffers in units of "Pages".

As illustrated in FIG. 5, the nonvolatile memory 115 forms a stripe of RAID5 (for example, the stripe 502 or 503) with Page data stored in a predetermined "Page" in each of the "Dies 313 to 320" that are physically separated from each other and parity data. That is, the nonvolatile memory 115 provides redundancy for pieces of data (pieces of Page data) to be transferred via physically different data buffers (the nonvolatile memory 115 forms the configuration of RAID5). By causing the nonvolatile memory 115 to form a RAID5 stripe (for example, the stripe 502 or 503) with a predetermined data unit, even if one of the pieces of data (pieces of Page data) in the stripe (for example, the stripe 502 or 503) becomes an error, the error data can be restored. When error data can be restored with a redundant data structure in the nonvolatile memory 115, even if an error occurs in the process of transfer of data from the volatile memory 113 to the nonvolatile memory 115, the FPGA 114 can transfer the data (of approximately 2 Mbytes) to the nonvolatile memory 115 without writing back the data, which has started to be transferred in response to an instruction from the CPU 112, from the top of the data. The error data can be restored after the FPGA 114 has completed the writing of the data in the nonvolatile memory 115.

The boot buffer 804 is a storage region for primarily storing information used for activation of the Die 313. The error correction circuit 809 is used to correct transfer error data in the Die 313.

Thus, the nonvolatile memory 115 includes a plurality of data buffers to which regions (data storage regions) in the nonvolatile memory 115 are individually allocated.

The FPGA 114 sequentially writes (stores) a predetermined amount of data into the nonvolatile memory 115 in response to an instruction transmitted from the CPU 112. The larger the amount of data the FPGA 114 writes into the nonvolatile memory 115 in response to a single instruction transmitted from the CPU 112, the shorter the time for the FPGA 114 to write data into the nonvolatile memory 115. The reason for this is that the number of instructions transmitted from the CPU 112 to the FPGA 114 is small when the FPGA 114 writes a large amount of data into the nonvolatile memory 115.

On the other hand, the larger the amount of data the FPGA 114 writes into the nonvolatile memory 115 in response to a single instruction, the higher the probability that an error occurs in the process of writing of data. When an error occurs in the process of writing of data, the FPGA 114 rewrites the data in response to an instruction. Accordingly, when the occurrence of an error increases the amount of data to be written back, the time for the FPGA 114 to write (save) data into the nonvolatile memory 115 is increased. Furthermore, when an error occurs in the process of writing of pieces of data and the FPGA 114 writes back the pieces of data into an original region, the FPGA 114 needs to delete from the nonvolatile memory 115 some of the pieces of data that have been successfully written into the nonvolatile memory 115 in response to an instruction transmitted from the CPU 112 and then to write back the pieces of data. In this case, it takes time for the FPGA 114 to delete (erase) from the nonvolatile memory 115 the data that has been successfully written into the nonvolatile memory 115 before the occurrence of the error. When the FPGA 114 receives an instruction from a CPU a plurality of times, the FPGA 114 manages data writing each time the instruction is transmitted thereto. The FPGA 114 sequentially writes pieces of data each having a predetermined data amount into the nonvolatile memory 115. When an error occurs in one of the pieces of data, the FPGA 114 deletes a part of the data that has been successfully written.

Accordingly, in an embodiment, redundancy is provided for a predetermined data unit (a stripe unit such as the stripe 502 or 503) that is composed of pieces of data successively written in the nonvolatile memory 115 by the FPGA 114 in response to an instruction transmitted from the CPU 112. That is, the FPGA 114 generates parity data for a predetermined amount of data to be transferred to the nonvolatile memory 115 and stores the data and the parity data in the nonvolatile memory 115.

The FPGA 114 successively writes a predetermined amount of data into the nonvolatile memory 115 in response to an instruction transmitted from the CPU 112. When an error occurs in the process of writing of the data in the nonvolatile memory 115 and the FPGA 114 determines that the error data can be restored with parity data, the FPGA 114 does not write back the data, which has started to be written in response to the instruction from the CPU 112, from the top of the data. The FPGA 114 writes the remaining part of the data for which the CPU 112 has issued the instruction into the nonvolatile memory 115 after detecting the error.

When the FPGA 114 determines that the error data cannot be restored with the parity data, the FPGA 114 rewrite the data from the top of the data in another region (in an embodiment, for example, in the replacement area 1002 illustrated in FIG. 10) in the nonvolatile memory 115.

Consequently, the disk array apparatus 100 can reduce the number of times of data rewriting at the occurrence of an error in the process of writing of data without reducing the amount of data which the FPGA 114 successively writes into the nonvolatile memory 115 in response to an instruction transmitted from the CPU 112. Furthermore, the disk array apparatus 100 can reduce the time for deleting (erasing) data that has been successfully written in the nonvolatile memory 115 before the occurrence of the error. The disk array apparatus 100 can rapidly save data stored in the volatile memory 113 into the nonvolatile memory 115 in the disk controller 105.

The FPGA 114 stores data, via a plurality of buffers in the nonvolatile memory 115, in regions (data storage regions) that are individually allocated to the data buffers.

[2.6. DE Ports 116 and 122]

The DE port 116 is connected to the disks 107 to 110. The DE port 122 is also connected to the disks 107 to 110.

The DE port 116 is used to expand a drive enclosure (DE). In an embodiment, the DE port 116 can achieve the cascade connection of up to nine DEs. A single DE can be connected to, for example, six disks. Accordingly, the DE port 116 can be connected to up to 120 disks via DEs. In an embodiment, the disks 107 to 110 connected to the DE port 116 are illustrated.

[2.7. Restoration of Disk Array Apparatus 100]

When power to the disk array apparatus 100 is restored, the FPGA 114 writes back the data saved in the nonvolatile memory 115 into the volatile memory 113. More specifically, the data write-back unit 204 writes back the data saved in the nonvolatile memory 115 into the volatile memory 113. The CPU 112 instructs the data write-back unit 204 to write back the data saved in the nonvolatile memory 115 into the volatile memory 113. The data write-back unit 204 transfers the data stored in the nonvolatile memory 115 to the communication unit 201 via the buffer 217. The communication unit 201 transfers the data to the volatile memory 113 via the CPU 112.

After the data write-back unit 204 has transferred the data from the nonvolatile memory 115 to the volatile memory 113, the table management unit 206 resets the Dirty flag 901 in the defect management table 218 (sets the values of flags forming the Dirty flag 901 to "0"). The table management unit 207 similarly resets the Dirty flag in the defect management table 219. As a result, the disk array apparatus 100 according to an embodiment can effectively use the resource (capacity) of the nonvolatile memory 115. An area having the value "1" of the Dirty flag is a region in which the data transfer units 202 and 203 have failed to write data owing to a factor other than hardware breakage. That is, the area having the value "1" of the Dirty flag is a region in which the data transfer units 202 and 203 can succeed in performing data writing at a subsequent retry. Accordingly, by causing the table management units 206 and 207 to reset the value of the Dirty flag to "1" at the restoration of power, when a power outage occurs again, the data transfer units 202 and 203 can write (save) data in the area that have had the value "1" of the Dirty flag in the past.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A backup method for making a backup of cache data stored in a volatile memory to a nonvolatile memory by using a controller, the backup method comprising:
   writing the cache data stored in the volatile memory in a selected area of the nonvolatile memory;
   generating parity data by calculating an exclusive OR of each of a plurality of predetermined parts of the cache data in the volatile memory;
   generating a plurality of cyclic redundancy check codes from each of the predetermined parts of the cache data in the volatile memory respectively;
   checking an error of each of the predetermined parts of the cache data in the nonvolatile memory by using the cyclic redundancy check codes;
   verifying whether an error found in a checked part of the cache data in the nonvolatile memory can be recovered by using the parity data;
   rewriting a part of the cache data when the error found in the part of the cache data in the nonvolatile memory cannot be recovered by using the parity data in an area of the nonvolatile memory different from the selected area; and
   writing the generated parity data into the nonvolatile memory.

2. The backup method according to claim 1,
   wherein a disk array apparatus has a backup unit that supplies electric power temporarily when an electrical power failure occurs, and
   wherein said writing the cache data writes in a selected area of the nonvolatile memory when the electrical power failure occurs.

3. The backup method according to claim 1, comprising:
   storing data in a buffer, and obtaining an intermediate data result by calculating an exclusive OR of the data, wherein the intermediate result is stored in the buffer.

4. The backup method according to claim 3, comprising:
   updating data stored in the buffer with a new intermediate data result stored in the buffer.

5. The backup method according to claim 1, wherein checking further comprises determining whether a data error exists in data stripe formed from a plurality of pieces of data.

6. The backup method according to claim 1, wherein the parity data is generated separately from cyclic redundancy check code data.

7. The backup method according to claim 1, wherein the parity data is generated for multiple pages within the volatile memory and the plurality of cyclic redundancy check codes are each generated with one page in the volatile memory.

8. A disk array apparatus comprising:
   a volatile memory for storing cache data;
   a nonvolatile memory; and
   a controller that:
      writes the cache data stored in a volatile memory into a selected area of the nonvolatile memory,
      generates parity data by calculating an exclusive OR of each of a plurality of predetermined parts of the cache data in the volatile memory,
      generates a plurality of cyclic redundancy check codes from each of the predetermined parts of the cache data in the volatile memory respectively;
      checks an error of each of the predetermined parts of the cache data in the nonvolatile memory by using the cyclic redundancy check codes;
      verifies whether an error found in a checked part of the cache data in the nonvolatile memory can be recovered by using the parity data;
      rewrites a part of the cache data when the error found in the part of the cache data in the nonvolatile memory cannot be recovered by using the parity data in an area of the nonvolatile memory different from the selected area; and
      writes the generated parity data into the nonvolatile memory.

9. The disk array apparatus according to claim 8, comprising:
   a backup unit that supplies electric power to the disk array apparatus temporarily when an electrical power failure occurs, and
   wherein the controller writes the cache data in a selected area of the nonvolatile memory when the electrical power failure occurs.

10. The disk array apparatus according to claim 8, wherein the controller stores data in a buffer, and obtains an intermediate data result by calculating an exclusive OR of the data wherein the intermediate result is stored in the buffer.

11. The disk array apparatus according to claim 10, wherein the controller updates data stored in the buffer with a new intermediate data result.

12. The disk array apparatus according to claim 8, wherein the controller determines whether a data error exists in data stripe formed from a plurality of pieces of data.

13. The disk array apparatus according to claim 8, wherein the parity data is generated separately from cyclic redundancy check code data.

14. The disk array apparatus according to claim 8, wherein the parity data is generated for multiple pages within the volatile memory and the plurality of cyclic redundancy check codes are each generated with one page in the volatile memory.

15. A computer-readable recording medium executing computer program making a backup of cache data of a disk array apparatus to a nonvolatile memory, the cache data being stored in a volatile memory, the program being designed to make a computer perform a process comprising:
   writing the cache data stored in the volatile memory into a selected area of the nonvolatile memory;
   generating parity data by calculating an exclusive OR of each of a plurality of predetermined parts of the cache data in the volatile memory;
   generating a plurality of cyclic redundancy check codes from each of the predetermined parts of the cache data in the volatile memory respectively;
   checking an error of each of the predetermined parts of the cache data in the nonvolatile memory by using the cyclic redundancy check codes;
   verifying whether an error found in a checked part of the cache data in the nonvolatile memory can be recovered by using the parity data;
   rewriting a part of the cache data when the error found in the part of the cache data in the nonvolatile memory cannot be recovered by using the parity data in an area of the nonvolatile memory different from the selected area; and
   writing the generated parity data into the nonvolatile memory.

16. The computer-readable recording medium according to claim 15,
   wherein a disk array apparatus has a backup unit that supplies electric power temporarily when an electrical power failure occurs, and
   wherein said writing of cache data writes in a selected area of the nonvolatile memory when the electrical power failure occurs.

17. The computer-readable recording medium according to claim 15, comprising:
   storing data in a buffer, and obtaining an intermediate data result by calculating an exclusive OR of the data, wherein the intermediate result is stored in the buffer.

18. The computer-readable recording medium according to claim 17, comprising:
   updating data stored in the buffer with a new intermediate data result stored in the buffer.

19. The computer-readable recording medium according to claim 15, wherein checking includes determining whether a data error exists in data stripe formed from a plurality of pieces of data.

20. The computer-readable recording medium according to claim 15, wherein the parity data is generated separately from cyclic redundancy check code data.

* * * * *